United States Patent
Chen et al.

(10) Patent No.: US 10,705,427 B2
(45) Date of Patent: Jul. 7, 2020

(54) METHOD FOR MAKING A GRATING

(71) Applicants: Tsinghua University, Beijing (CN); HON HAI PRECISION INDUSTRY CO., LTD., New Taipei (TW)

(72) Inventors: Mo Chen, Beijing (CN); Li-Hui Zhang, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 282 days.

(21) Appl. No.: 16/003,007

(22) Filed: Jun. 7, 2018

(65) Prior Publication Data
US 2018/0373153 A1    Dec. 27, 2018

(30) Foreign Application Priority Data
Jun. 26, 2017  (CN) .......................... 2017 1 0496750

(51) Int. Cl.
| | | |
|---|---|---|
| G03F 7/20 | (2006.01) | |
| G03F 7/26 | (2006.01) | |
| G03F 7/09 | (2006.01) | |
| G03F 7/095 | (2006.01) | |

(52) U.S. Cl.
CPC ............ *G03F 7/2061* (2013.01); *G03F 7/094* (2013.01); *G03F 7/095* (2013.01); *G03F 7/203* (2013.01); *G03F 7/2022* (2013.01); *G03F 7/2037* (2013.01); *G03F 7/26* (2013.01)

(58) Field of Classification Search
CPC ........ G03F 7/094; G03F 7/095; G03F 7/2022; G03F 7/203; G03F 7/2037; G03F 7/2061; G03F 7/26
USPC ........................................ 430/296, 312, 942
See application file for complete search history.

(56) References Cited

U.S. PATENT DOCUMENTS 4,835,083 A * 5/1989 Sakai ..................... B82Y 10/00
430/130

* cited by examiner

*Primary Examiner* — Christopher G Young
(74) *Attorney, Agent, or Firm* — ScienBiziP, P.C.

(57) ABSTRACT

A method of making a grating, the method including: providing a substrate, placing a first photoresist layer on the substrate, locating a second photoresist layer on the first photoresist layer, wherein a second exposure dose of the second photoresist layer is greater than a first exposure dose of the first photoresist layer; exposing the first photoresist layer and the second photoresist layer; developing the first photoresist layer and the second photoresist layer and removing an exposed photoresist to form a patterned photoresist layer and obtain an exposed surface of the substrate, wherein the patterned photoresist layer defines a plurality of top surfaces and a plurality of side surfaces, each adjacent top surface and side surface, and the exposed surface form a Z-type surface; depositing a preformed layer on the Z-type surface to form a Z-type structure; removing the patterned photoresist layer.

11 Claims, 7 Drawing Sheets

METHOD FOR MAKING A GRATING

FIELD

The subject matter herein generally relates to a method for making a grating.

BACKGROUND

Gratings are important components in modern precision instruments. The grating can be made by electron beam lithography, focused ion beam lithography, deep-ultraviolet lithography, holographic lithography, and nano-imprint lithography. However, the cost of the above methods is expensive, the precision of the mask layer is not high, and the grating fabrication process is complicated.

What is needed, therefore, is to provide a low-cost, high precision, and simple method for making the grating.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will be described, by way of example only, with reference to the attached figures

DETAILED DESCRIPTION

Figure 1:
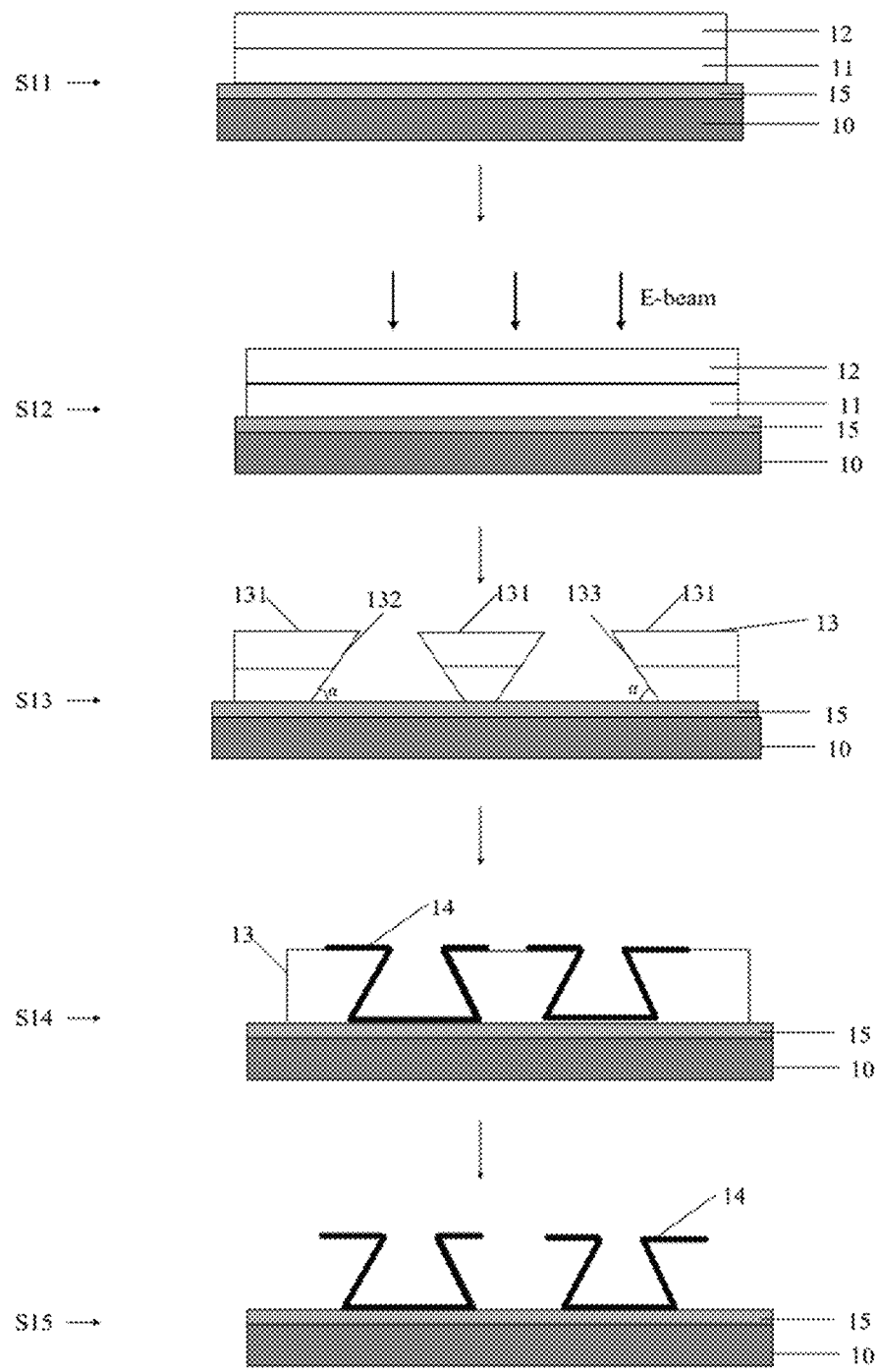
FIG. 1 is a flow chart of an embodiment of a method for making grating.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape, or other feature that the term modifies, such that the component need not be exact. The term "comprising" means "including, but not necessarily limited to"; it specifically indicates open-ended inclusion or membership in a so-described combination, group, series, and the like. It should be noted that references to "an" or "one" embodiment in this disclosure are not necessarily to the same embodiment, and such references mean "at least one".

In FIG. 1, an embodiment of a method of making a grating comprises:

S11, providing a substrate 10, placing a first photoresist layer 11 and a second photoresist layer 12 on the substrate 10, wherein the first photoresist layer 11 and the second photoresist layer 12 are stacked in that order, the exposure dose of the second photoresist layer 12 is greater than the exposure dose of the first photoresist layer 11;

S12, patterned exposing the first photoresist layer 11 and the second photoresist layer 12 to electron beam by using a pattern as an exposure pattern;

S13, developing the first photoresist layer 11 and the second photoresist layer 12 to form a patterned photoresist layer 13;

S14, depositing a preformed layer 14 on the patterned photoresist layer 13 and the substrate 10 to form a Z-type structure;

S15, removing the patterned photoresist layer 13.

In step S11, the material of the substrate 10 can be insulating materials such as silica or silicon nitride. The material of the substrate 10 can also be conductive materials such as gold, aluminum, nickel, chromium, or copper. Also the material of the substrate 10 can be semiconductor materials such as silicon, gallium nitride, or gallium arsenide. In one embodiment, the material of the substrate 10 is a silicon wafer.

The first photoresist layer 11 can be directly coated on the substrate 10 by spin coating, the first photoresist layer 11 can also be transferred directly to the substrate 10. The first photoresist layer 11 is electron beam photoresist layer. The exposure dose of the first photoresist layer 11 is less than 300 $\mu C/cm^2$. The first photoresist layer 11 is a positive photoresist layer with an exposure dose in a range of 200 $\mu C/cm^2$ to 300 $\mu C/cm^2$. The thickness of the first photoresist layer 11 is in a range of 100 nanometers to 300 nanometers. In one embodiment, the first photoresist layer 11 is directly coated on the substrate 10 by spin coating, the material of the first photoresist layer 11 is ZEP 520A, the thickness of the first photoresist layer 11 is 150 nanometers, and the exposure dose of the first photoresist layer 11 is 250 $\mu C/cm^2$.

The second photoresist layer 12 is stacked on the first photoresist layer 11. The second photoresist layer 12 can be directly coated on the first photoresist layer 11 by spin coating, the second photoresist layer 12 can also be transferred directly to the first photoresist layer 11. The second photoresist layer 12 is also electron beam photoresist. The type of the second photoresist layer 12 is the same as the type of the first photoresist layer 11. The exposure dose of the second photoresist layer 12 should be greater than the exposure dose of the first photoresist layer 11. The radio of the exposure dose of the second photoresist layer 12 to the exposure dose of the first photoresist layer 11 is greater than 3:1. The exposure dose of the second photoresist layer 12 is greater than 750 $\mu C/cm^2$. The exposure dose of the second photoresist layer 12 can be equal to or greater than 900

μC/cm². The thickness of the second photoresist layer 12 is in a range of 100 nanometers to 300 nanometers. In one embodiment, the second photoresist layer 12 is directly coated on the first photoresist layer 11 by spin coating, the material of the second photoresist layer 12 is PMMA 950A4, the thickness of the second photoresist layer 12 is 150 nanometers, and the exposure dose of the second photoresist layer 12 is 1000 μC/cm².

In step S12, the first photoresist layer 11 and the second photoresist layer 12 are exposed by using a pattern as an exposure pattern. The shape and size of the pattern can be set according to need.

Figure 2:
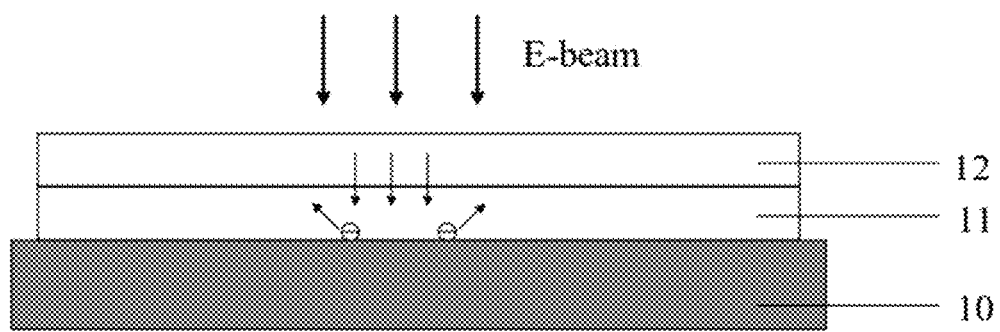
FIG. 2 is a schematic view of an embodiment of an exposure process of a first photoresist layer and a second photoresist layer.

Referring to FIG. 2, a process of exposing the first photoresist layer 11 and the second photoresist layer 12 using the pattern comprises: irradiating on the pattern area of the second photoresist layer 12 using an electron beam; sequentially penetrating the second photoresist layer 12 and the first photoresist layer 11. Due to high energy of some electrons after passing through the second photoresist layer 12 and the first photoresist layer 11, backscattering occurs when the electrons reach the substrate 10. The electrons can be reflected from the substrate 10 and are incident again into the first photoresist layer 11, and a very small number of electrons may be incident on the second photoresist layer 12. Since the exposure dose of the first photoresist layer 11 is less than the exposure dose of the second photoresist layer 12, the exposed area of the first photoresist layer 11 is slightly larger than the exposed area of the second photoresist layer 12. And the backscattered electrons are incident on the first photoresist layer 11 and continue to expose the first photoresist layer 11. Thus, the exposed area of the first photoresist layer 11 can be further enlarged under the double effects of the electron beam and the backscattered electrons.

Furthermore, a secondary electron emission layer 15 can be disposed between the first photoresist layer 11 and the substrate 10. When the electron beam passes through the second photoresist layer 12 and the first photoresist layer 11 and is incident on the secondary electron emission layer 15, the secondary electron emission layer 15 is excited to generate secondary electrons. The secondary electrons can be incident on the first photoresist layer 11 to enlarge the exposed area of the first photoresist layer 11. The material of the secondary electron emission layer 15 can be calcium oxide, barium oxide, cesium oxide.

Figure 3:
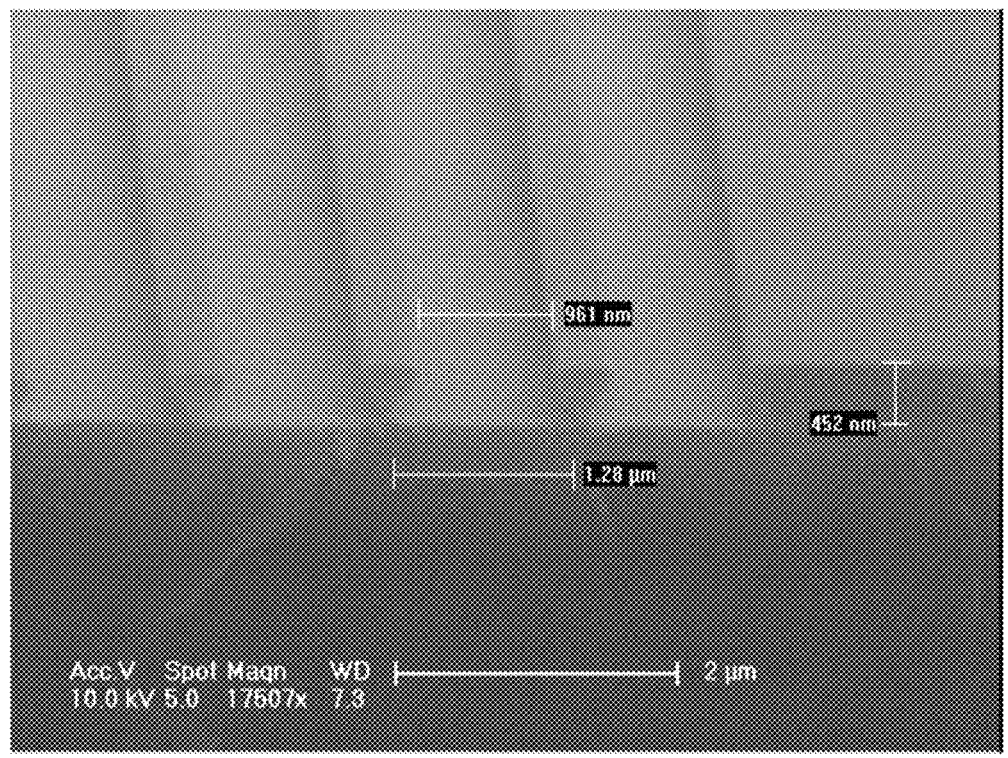
FIG. 3 is a Scanning Electron Microscope (SEM) image of a patterned photoresist layer.

In step S13, the method of developing the second photoresist layer 12 and the first photoresist layer 11 comprises: placing the second photoresist layer 12 and the first photoresist layer 11 into a developer to remove photoresist in the exposed area. After removing the photoresist, a part surface of the substrate 10 corresponding to the exposed area exposed. In one embodiment, the developer is a mixed solution of amyl acetate, and the developing time is about 90 s. The developer is not limited to above and can be any solution as long as the exposed photoresist can be developed. A fixer can further be used, and the fixing time is about 30 s. Referring to FIG. 3, a Scanning Electron Microscope (SEM) image of the patterned photoresist layer, a plurality of parallel and spaced stripe photoresist are obtained. Since the exposed area of the first photoresist layer 11 is larger than the exposed area of the second photoresist layer 12, the removed photoresist area of the first photoresist layer 11 is larger than the removed photoresist area of the second photoresist layer 12. Thus, the patterned photoresist layer 13 is a structure with a wide top-portion and a narrow bottom-portion. The patterned photoresist layer 13 defines a plurality of top surfaces and a plurality of side surfaces. The top surfaces 131 are away from the substrate 10 and parallel with the substrate 10. The side surfaces are formed after removing the exposed photoresist. The angle between the side surfaces and the top surfaces, the substrate is α, and 0<α<90 degrees. The angle α can be 70 degrees<α<90 degrees. The side surfaces include a plurality of first side surfaces 132 and a plurality of second surfaces 133. Each adjacent first side surface 132 and second side surface 133 are distributed mirror-symmetrically. Each adjacent top surface and side surface, and an exposed surface of the substrate 10 connected to the side surface can form a Z-type surface. The side surface can be the first side surface 132 or the second side surface 133. Surfaces of the patterned photoresist layer 13 and the exposed surfaces of the substrate can form a plurality of Z-type surfaces.

In step S14, a preformed layer 14 is deposited on the surfaces of the patterned photoresist layer 13 and the exposed surfaces of the substrate 10 to form a Z-type structure. The surfaces of the patterned photoresist layer 13 includes the plurality of top surfaces 131, the plurality of first side surfaces 132 and the plurality of second side surfaces 133. The Z-type structure refers to bars with a Z-shaped cross-section. The preformed layer 14 can continuously cover the plurality of Z-type surfaces. The preformed layer 14 can discontinuously cover the plurality of Z-type surfaces. Thus, the preformed layer 14 includes a plurality of Z-type structure units.

Figure 4:
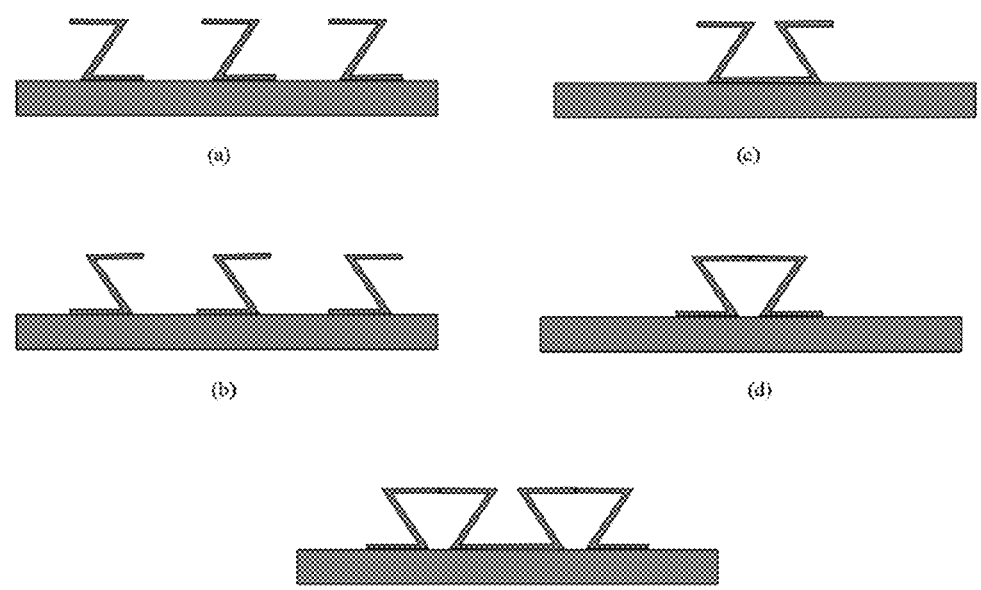
FIG. 4 is a schematic view of an embodiment of a Z-type grating.

Referring to FIG. 4(a)-(b), the preformed layer 14 is not continuous. The preformed layer 14 can only cover each adjacent top surface 131 and first side surface 132, and the exposed surface of the substrate 10 connected to the first side surface 132 continuously. Thus, the preformed layer 14 includes a plurality of Z-type structure units, and each adjacent Z-type structure units are spaced from each other. The preformed layer 14 can only cover each adjacent top surface 131 and second side surface 133, and the exposed surface of the substrate 10 connected to the second side surface 133 continuously. Thus, the preformed layer 14 includes a plurality of Z-type structure units, and each adjacent Z-type structure units are spaced from each other.

Referring to FIG. 4(c)-(e), the preformed layer 14 can continuously cover the plurality of Z-type surfaces to obtain a plurality of interconnected Z-type structure units. The preformed layer 14 can include at least one mirror-symmetrical Z-type structure. The preformed layer 14 can include a plurality of mirror-symmetrical Z-type structures. Each adjacent mirror-symmetrical Z-type structures can be continuous or discontinuous. In one embodiment, the preformed layer 14 includes a plurality of mirror-symmetrical Z-type structures, and each adjacent mirror-symmetrical Z-type structures are discontinuous.

The material of the preformed layer 14 can be insulating materials such as silica or silicon nitride. The material of the preformed layer 14 can also be conductive materials such as gold, aluminum, nickel, chromium, or copper. Also the material of the preformed layer 14 can be semiconductor materials such as silicon, gallium nitride, or gallium arsenide. The material of the preformed layer 14 is not limited as long as the preformed layer 14 can not be removed when the photoresist is removed. The method of making the preformed layer 14 can be magnetron sputtering, vapor deposition, chemical vapor deposition. The thickness of the preformed layer 14 is in a range of 30 nanometers to 50 nanometers. In one embodiment, the material of the preformed layer 14 is aluminum, the preformed layer 14 is formed by the vapor deposition, the thickness of the preformed layer 14 is 40 nanometers.

In step S15, the patterned photoresist layer 13 can be removed by chemical reagent. The chemical reagent can be acetone, or butanone. In one embodiment, the patterned photoresist layer 13 is removed by butanone. After removing the patterned photoresist layer 13, the preformed layer 14 is a continuous and free-standing structure, and the whole structure of the preformed layer 14 is not destroyed.

Figure 5:
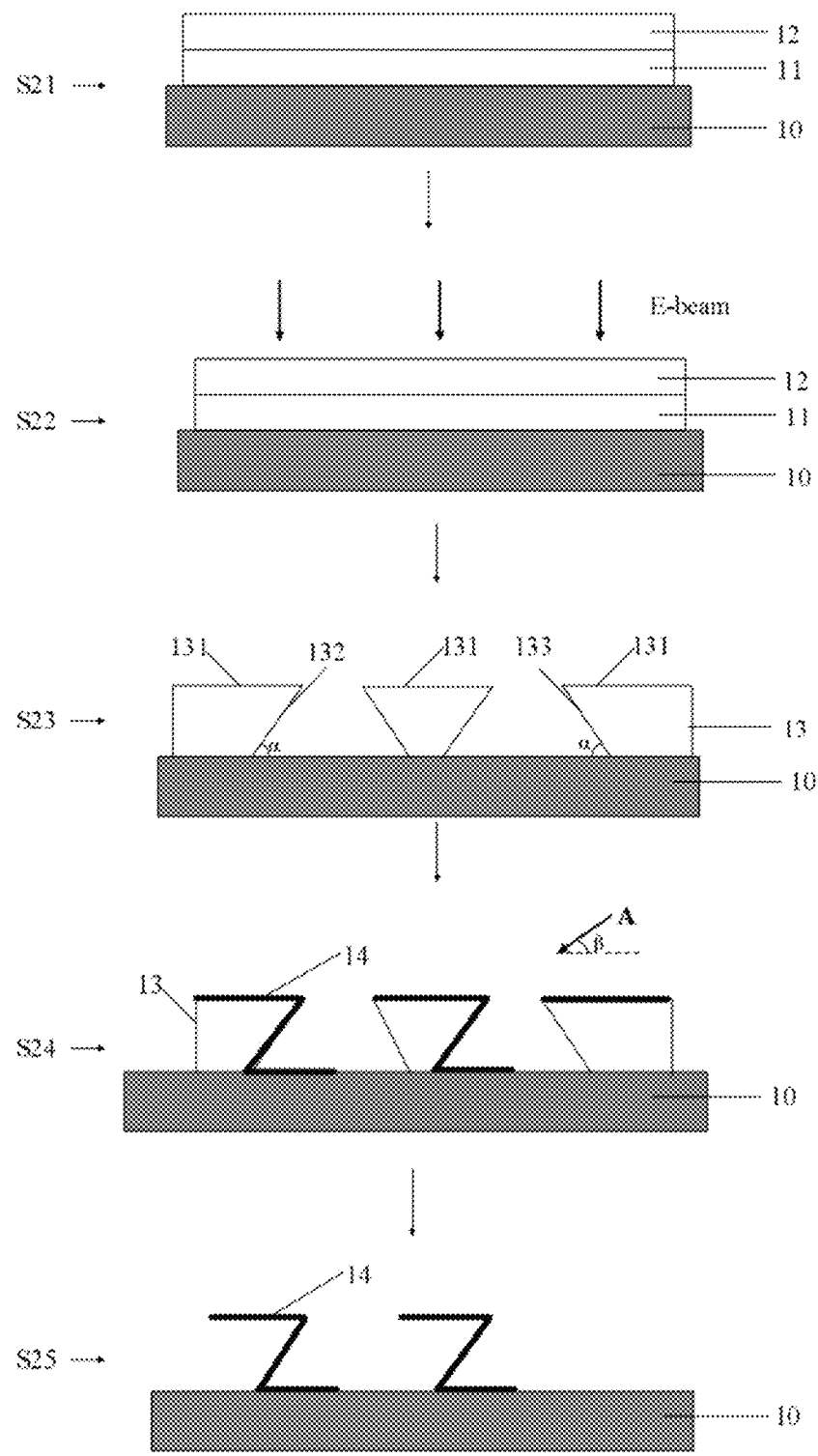
FIG. 5 is a flow chart of an embodiment of a method for making a grating.

Referring to FIG. 5, an embodiment of a method of making a grating comprises:

S21, providing a substrate 10, placing a first photoresist layer 11 and a second photoresist layer 12 on the substrate 10, wherein the first photoresist layer 11 and the second photoresist layer 12 are stacked in that order, the exposure dose of the second photoresist layer 12 is greater than the exposure dose of the first photoresist layer 11;

S22, exposing the first photoresist layer 11 and the second photoresist layer 12;

S23, developing the first photoresist layer 11 and the second photoresist layer 12 to form a patterned photoresist layer 13 and obtain an exposed surface of the substrate 10, the patterned photoresist layer 13 defines a plurality of top surfaces 131, a plurality of first side surfaces 132, a plurality of second side surfaces 133;

S24, depositing a preformed layer 14 on the top surfaces 131, the first side surfaces 132 and the exposed surface of the substrate 10;

S25, removing the patterned photoresist layer 13.

Figure 6:
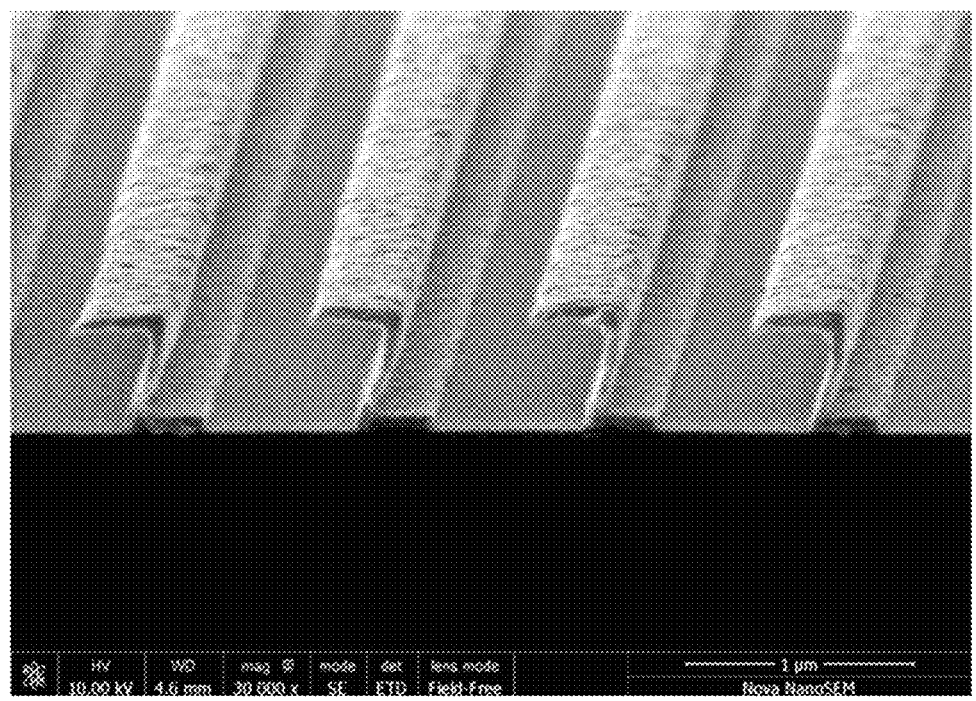
FIG. 6 is a Scanning Electron Microscope (SEM) image of the Z-type grating.

The method of making the grating in FIG. 5 is similar to the method of making the grating in FIG. 1 except that the preformed layer 14 does not cover all the side surfaces. The preformed layer 14 only covers the first side surfaces 132 of the side surfaces. Thus, a plurality of Z-type structure units are obtained, and the plurality of Z-type structure units are spaced from each other and have a same orientation. A direction A can be used as the deposition direction to deposit the preformed layer 14. The angle between the direction A and the substrate 10 is set to $\beta$, the angle $\beta$ should satisfy $0<\beta<\alpha$. The angle $\beta$ can be $\alpha/2<\beta<\alpha$. Referring to FIG. 6, a SEM image of the Z-type grating.

Figure 7:
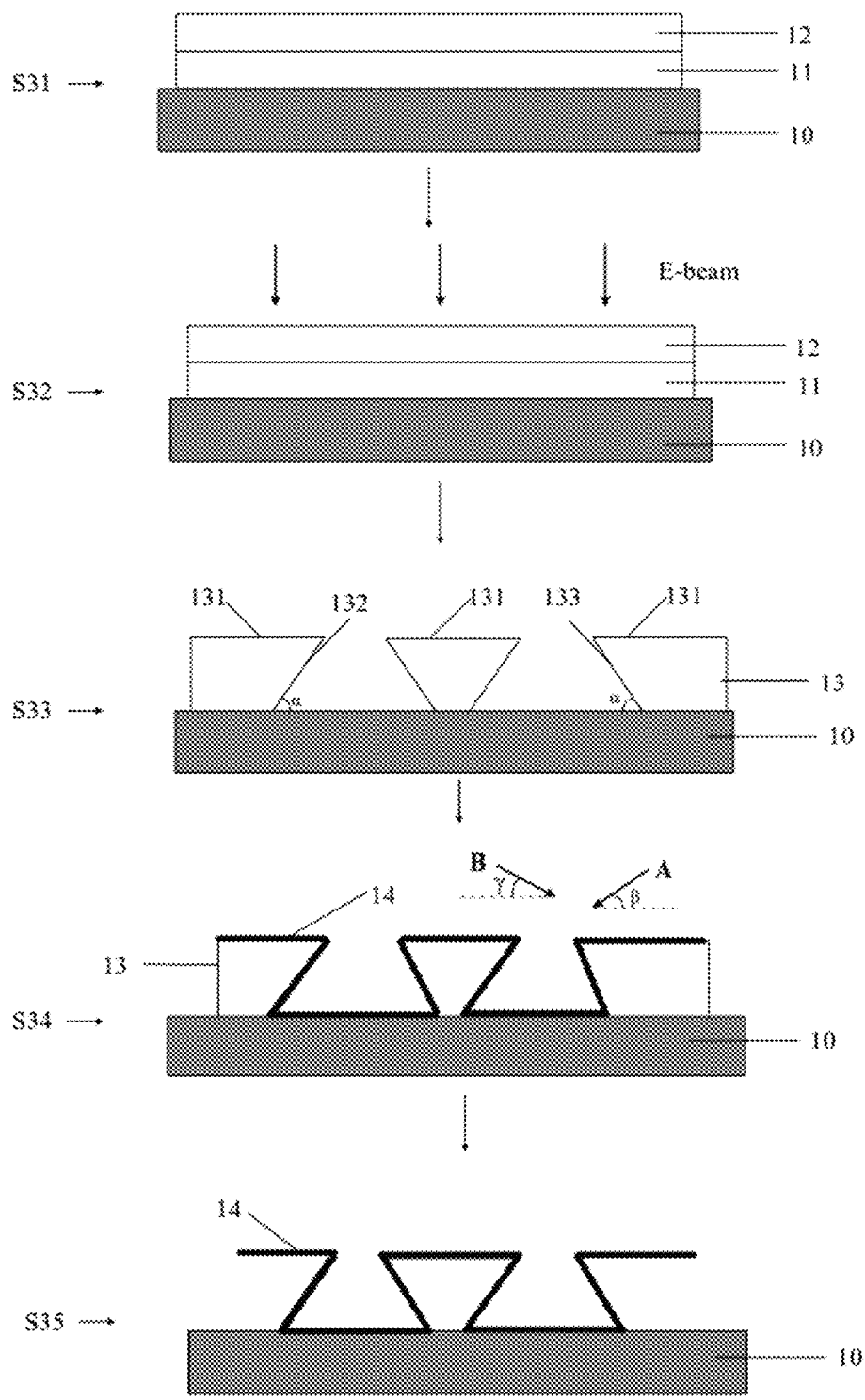
FIG. 7 is a flow chart of an embodiment of a method for making a grating.

Referring to FIG. 7, an embodiment of a method of making a grating comprises:

S31, providing a substrate 10, placing a first photoresist layer 11 and a second photoresist layer 12 on the substrate 10, wherein the first photoresist layer 11 and the second photoresist layer 12 are stacked in that order, the exposure dose of the second photoresist layer 12 is greater than the exposure dose of the first photoresist layer 11;

S32, exposing the first photoresist layer 11 and the second photoresist layer 12;

S33, developing the first photoresist layer 11 and the second photoresist layer 12 to form a patterned photoresist layer 13 and obtain an exposed surface of the substrate 10, the patterned photoresist layer 13 defines a plurality of top surfaces 131, a plurality of first side surfaces 132, a plurality of second side surfaces 133;

S34, depositing a preformed layer 14 on the top surfaces 131, the first side surfaces 132, the second side surfaces 133 and the exposed surface of the substrate 10;

S35, removing the patterned photoresist layer 13.

The method of making the grating in FIG. 7 is similar to the method of making the grating in FIG. 5 except that the preformed layer 14 is a continuous structure and covers the top surfaces 131, the first side surfaces 132, the second side surfaces 133 and the exposed surface of the substrate. A direction A and a direction B can be used as the deposition directions to deposit the preformed layer 14. The angle between the direction A and the substrate 10 is less than the angle $\alpha$, the angle between the direction B and the substrate 10 is set to $\gamma$, the angle $\gamma$ should satisfy $0<\gamma<\alpha$. The angle $\gamma$ can be $\alpha/2<\gamma<\alpha$. For example, the Z-type structure of FIG. 4(c)-4(e) can be formed by depositing continuously with the direction A and the direction B. The substrate 10 can be rotated so that the angle between the deposition direction and the substrate changes from the direction A to the direction B.

The advantages of the method of making grating are described below. A continuous Z-type structure can be obtained by exposing and developing photoresists with different exposure doses. no etching and mask structures are required in this method. The method is simple and the cost is low. Since the photoresist can be coated on a large area, a large-area periodic grating can be prepared, and the grating yield is improved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. A method of making a grating, the method comprising:
placing a first photoresist layer on a substrate, locating a second photoresist layer on the first photoresist layer, wherein a second exposure dose of the second photoresist layer is greater than a first exposure dose of the first photoresist layer;
exposing the first photoresist layer and the second photoresist layer to electron beam by using a pattern as an exposure pattern;
developing the first photoresist layer and the second photoresist layer and removing an exposed photoresist to form a patterned photoresist layer and obtain an exposed surface of the substrate, wherein the patterned photoresist layer defines a plurality of top surfaces and a plurality of side surfaces, adjacent top surface, side surface, and the exposed surface form a Z-type surface;
depositing a preformed layer on the Z-type surface to form a Z-type structure;
removing the patterned photoresist layer.

2. The method as claimed in claim 1, wherein a first material of the first photoresist layer is a first electron beam photoresist, and a second material of the second photoresist layer is a second electron beam photoresist.

3. The method as claimed in claim 1, wherein a radio of the second exposure dose of the second photoresist layer to the first exposure dose of the first photoresist layer is greater than 3:1.

4. The method as claimed in claim 1, wherein a thickness of the second photoresist layer is in a range of 100 nanometers to 300 nanometers.

5. The method as claimed in claim 1, wherein the exposing the first photoresist layer and the second photoresist layer comprises:

irradiating on the second photoresist layer using an electron beam;

sequentially penetrating the second photoresist layer and the first photoresist layer.

6. The method as claimed in claim 5, wherein part electrons of the electron beam produce backscattered electrons when the electron beam reaches the substrate, the backscattered electrons are incident on the first photoresist layer to expose the first photoresist layer again.

7. The method as claimed in claim 6, wherein a first exposure area of the first photoresist layer is larger than a second exposure area of the second photoresist layer.

8. The method as claimed in claim 1, wherein the top surfaces are away from and parallel with the substrate, the side surfaces are formed after removing the exposed photoresist, the side surfaces comprise the first side surfaces and the second side surfaces, the first side surfaces and second side surfaces are distributed mirror-symmetrically.

9. The method as claimed in claim 8, wherein an angle between the side surfaces and the top surfaces is $\alpha$, and $0<\alpha<90$ degrees.

10. The method as claimed in claim 8, wherein the preformed layer is only deposited on the top surfaces, first side surfaces and the exposed surface of the substrate and forms a plurality of Z-type structure units with a same orientation.

11. The method as claimed in claim 8, wherein the preformed layer is deposited on all of the top surfaces, first side surfaces, second side surfaces and the exposed surface of the substrate and forms a continuous Z-type structure.

* * * * *